United States Patent
Sharma

(10) Patent No.: US 11,081,960 B2
(45) Date of Patent: Aug. 3, 2021

(54) TIMER FOR POWER CONVERTER CONTROLLER

(71) Applicant: TEXAS INSTRUMENTS INCORPORATED, Dallas, TX (US)

(72) Inventor: Anmol Sharma, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/927,302

(22) Filed: Mar. 21, 2018

(65) Prior Publication Data

US 2019/0181757 A1   Jun. 13, 2019

Related U.S. Application Data

(60) Provisional application No. 62/596,624, filed on Dec. 8, 2017.

(51) Int. Cl.
| | |
|---|---|
| *H02M 3/158* | (2006.01) |
| *H03K 5/131* | (2014.01) |
| *H02M 3/157* | (2006.01) |
| *H02M 1/00* | (2006.01) |

(52) U.S. Cl.
CPC .......... *H02M 3/1582* (2013.01); *H03K 5/131* (2013.01); *H02M 3/157* (2013.01); *H02M 2001/0003* (2013.01)

(58) Field of Classification Search
CPC ....... H02M 3/155–158; H02M 3/1582; H02M 3/1584; H02M 3/1588; H02M 2001/0003; H02M 2001/0012; H02M 2001/0041; H03K 5/131

USPC .......................................... 323/271, 282–285
See application file for complete search history.

(56) References Cited

U.S. PATENT DOCUMENTS

| | | | |
|---|---|---|---|
| 7,495,419 B1 | 2/2009 | Ju | |
| 9,143,046 B2 | 9/2015 | Adragna et al. | |
| 9,680,378 B2 | 6/2017 | Nakamura | |
| 2008/0284397 A1* | 11/2008 | Chang | H02M 3/157 323/283 |
| 2009/0160414 A1* | 6/2009 | Hachiya | H02M 3/156 323/283 |
| 2009/0200995 A1 | 8/2009 | Tran et al. | |

(Continued)

FOREIGN PATENT DOCUMENTS

| | | |
|---|---|---|
| CN | 106385176 | 2/2017 |
| DE | 102016105358 A1 | 10/2016 |

OTHER PUBLICATIONS

Search Report for PCT Application No. PCT/US18/64748, 1 page.

(Continued)

*Primary Examiner* — Thienvu V Tran
*Assistant Examiner* — Ivan Laboy
(74) *Attorney, Agent, or Firm* — Ray A. King; Charles A. Brill; Frank D. Cimino

(57) ABSTRACT

Aspects of the disclosure provide for a circuit. In an example, the circuit includes an input circuit having a first output and a second output, a first timer having a first input coupled to the first output of the input circuit, a second timer having a first input coupled to the second output of the input circuit, a second input coupled to an output of the first timer, and an output coupled to a second input of the first timer, and an output circuit coupled to the output of the first timer and the output of the second timer.

15 Claims, 4 Drawing Sheets

(56) References Cited

U.S. PATENT DOCUMENTS

| | | | | |
|---|---|---|---|---|
| 2009/0237049 A1* | 9/2009 | Hachiya | ................ | H02M 3/156 |
| | | | | 323/282 |
| 2011/0279098 A1 | 11/2011 | Ren et al. | | |
| 2012/0062201 A1* | 3/2012 | Hachiya | .............. | H02M 3/1588 |
| | | | | 323/283 |
| 2012/0274295 A1* | 11/2012 | Lin | .................... | H02M 3/1582 |
| | | | | 323/282 |

OTHER PUBLICATIONS

DE102016105358A1 Machine Translation (16 pages).
European Search Report Application No. 18886200.7-1202/ 3721541 PCT/US2018064748, dated Dec. 4, 2020, 2 pages.

\* cited by examiner

TIMER FOR POWER CONVERTER CONTROLLER

CROSS-REFERENCE TO RELATED APPLICATIONS

The present application claims priority to U.S. Provisional Patent Application No. 62/596,624 filed Dec. 8, 2017, by Anmol Sharma and entitled "POWER CONVERTER CONTROLLER," which is incorporated herein by reference as if reproduced in its entirety.

BACKGROUND

A switched mode power supply (SMPS) transfers power from an input power source to a load by switching one or more power transistors coupled through a switch node/terminal to an energy storage element (such as an inductor/transformer and/or capacitor), which is capable of coupling to the load. The power transistors can be included in a power converter that includes, or is capable of coupling to, the energy storage element. A SMPS can include a SMPS controller to provide one or more gate drive signals to the power transistor(s).

SUMMARY

Aspects of the disclosure provide for a circuit. In an example, the circuit includes an input circuit having a first output and a second output, a first timer having a first input coupled to the first output of the input circuit, a second timer having a first input coupled to the second output of the input circuit, a second input coupled to an output of the first timer, and an output coupled to a second input of the first timer, and an output circuit coupled to the output of the first timer and the output of the second timer.

Other aspects of the disclosure provide for a switched mode power supply (SMPS), comprising a power converter and a controller. In an example, the controller includes a loop controller, a predictive timer, and a gate driver. The loop controller is configured to couple to the power converter to monitor at least one electrical characteristic of the power converter and generate a control signal based at least partially on the monitored electrical characteristic of the power converter. The predictive timer is configured to couple to the loop controller and independently determine an on-time (TON) and an off-time (TOFF) for at least some power transistors of the power converter. The gate driver is configured to couple to the predictive timer and the power converter to control the power converter according to the determined TON and the determined TOFF.

Other aspects of the disclosure provide for a method. In an example, the method includes receiving a plurality of signals for use in calculating an TON and TOFF, controlling a first timer and a second timer to begin counting at an edge transition of a control signal for controlling some power transistors of the power converter, controlling the second timer to pause counting at an expiration of the first timer. The method further includes controlling the second timer to resume counting at another edge transition of the control signal for controlling some power transistors of the power converter, controlling the first timer to resume counting at an expiration of the second timer, and generating an output signal based on an output of the first timer and the second timer.

BRIEF DESCRIPTION OF THE DRAWINGS

For a detailed description of various examples, reference will now be made to the accompanying drawings in which.

DETAILED DESCRIPTION

Figure 1:
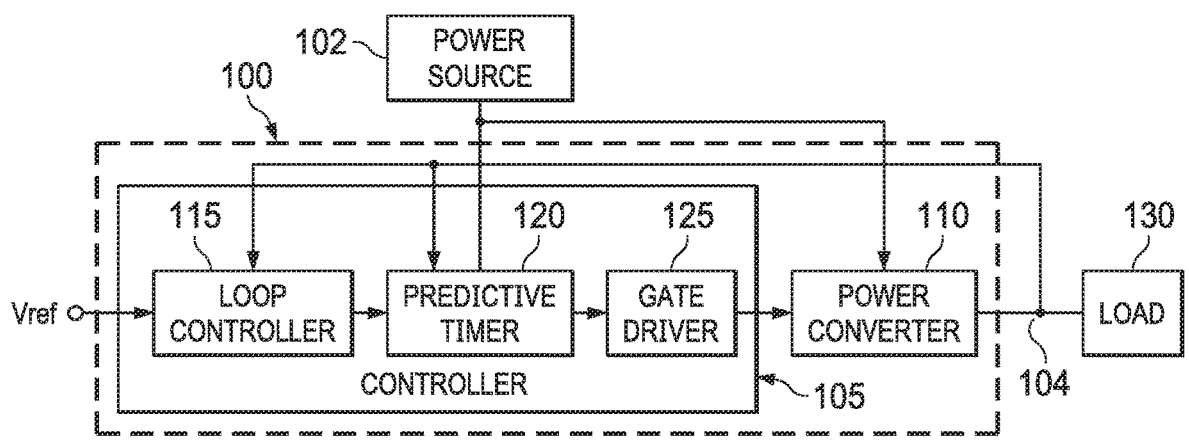
FIG. 1 is a block diagram of an illustrative switched mode power supply (SMPS)

In some switched mode power supply (SMPS) architectures (such as buck, boost, and/or buck-boost), the SMPS includes, or is capable of coupling to, an output/bulk capacitor in parallel with the load, and the controller switches the power transistor(s) to form circuit arrangements with the energy storage element(s) to supply a load current to the load and/or to the output/bulk capacitor to maintain a regulated output voltage (e.g., by filtering the switched load current). For example, a power transistor can be coupled through the switch node/terminal to an energy storage inductor, which is switched by the controller between charge and discharge cycles to supply inductor current (e.g., current through an energy storage inductor) to the load and to the output/bulk capacitor to filter the inductor current to maintain the regulated output voltage. In some examples, an SMPS can be configured for operation as a constant current source with an energy storage element but with no output/bulk capacitor.

The power transistors may be implemented as metal oxide semiconductor field effect transistors (MOSFETs) or other suitable solid-state transistor devices (e.g., such as bi-polar junction transistors (BJTs)). When a value of the input voltage received by the power converter is near a value of the output voltage provided by the power converter, the power converter may be said to be operating in a buck-boost region of operation. When the value of the input voltage is less than the value of the output voltage, the power converter operates in a boost region of operation. When the value of the input is greater than the value of the output voltage, the power converter operates in a buck region of operation. A buck-boost converter, for example, operates in the buck region, the boost region, and/or the buck-boost region. A boost converter, for example, operates in the boost region. A buck converter, for example, operates in the buck region. In various examples, not every power converter is capable of operating in more than one of the above regions. In some examples, the controller controls the power converter in the above three regions of operations according to a fixed-frequency ramp signal to control a period of time that at least some power transistors of the power converter are conductive during operation in one of the regions of operation. However, such a fixed frequency approach, in some circumstances, results in less than optimal performance of the power converter. For example, a fixed frequency approach may preclude modification of the frequency to optimize (e.g., reduce) switching losses, such as by reducing frequency in a buck region when values of Vin and Vout are near to each other. In contrast, at least one example of a controller controls a power converter by calculating an on time (TON) that at least some power transistors of the power converter are conductive and/or an off time (TOFF) that at least some power transistors of the power converter are not conductive. The TON and/or TOFF are calculated for the buck region of operation, the boost region of operation, and/or the buck-boost region of operation.

At least some aspects of the present disclosure relate to a controller that may be suitable for implementation for controlling a power converter, such as in a SMPS. In at least one example, the controller controls the power converter by determining (e.g., estimating, predicting, or calculating) TON and TOFF for at least some power transistors of the power converter. In various examples, the controller calculates TON and/or TOFF for a buck converter, a boost converter, or a buck-boost converter. The controller determines TON and/or TOFF, for example, using a timer circuit. In at least some examples, TON and TOFF are determined independently such that one is not based on the other.

Referring now to FIG. 1, a block diagram of an illustrative SMPS 100 is shown. In at least one example, the SMPS 100 includes a controller 105 and a power converter 110. The power converter 110 is, for example, a buck-boost power converter that is capable of operating in a buck-boost region (as well as a buck region, and a boost region). In other examples, the power converter 110 may be implemented as a buck converter (capable of operating in a buck region), a boost converter (capable of operating in a boost region), a hybrid converter, or any other power converter topology or architecture in which components of the power converter 110 may be omitted, rearranged, and/or additional components may be added to the power converter 110.

In at least one example, the controller 105 includes, or is configured to couple to, a loop controller 115, a predictive timer 120, and a gate driver 125. At least one example of the SMPS 100 includes at least some aspects of the controller 105 and the power converter 110 on a same semiconductor die and/or in a same component package, while in other examples the controller 105 and the power converter 110 may be fabricated separately and configured to couple together. For example, at least some aspects of the controller 105 may be fabricated separately and coupled together. Accordingly, while illustrated as including the gate driver 125, in at least one example the controller 105 does not include the gate driver 125 and instead is configured to couple to the gate driver 125. Additionally, while illustrated as including the predictive timer 120, in at least one example the controller 105 does not include the predictive timer 120 and instead is configured to couple to the predictive timer 120.

In at least one example, the SMPS 100 is configured to receive an input voltage (Vin) from an input power source 102 and provide an output voltage (Vout) at an output terminal 104 based at least partially on the input voltage and a reference voltage (Vref) received by the SMPS 100. Vref may be received from any suitable device (not shown) such as a processor, microcontroller, or any other device exerting control over the SMPS 100 to control a value of Vout and may be, or be representative of, a target or desired value for Vout. The SMPS 100, in at least one example, provides Vout to a load 130 that is coupled to the SMPS 100 (e.g., coupled to the SMPS 100 at an output of the power converter 110). In at least one example, the controller 105 receives one or more signals from the power converter 110. For example, the controller 105 may receive Vout from the power converter 110 and/or a value representative of an inductor current (IL) of the power converter 110. In various examples, the value representative of IL may be a value directly measured from an inductor (not shown) of the power converter 110 (or a terminal of another component of the power converter 110 to which the inductor is also coupled) or a value sensed from a sense element (not shown) of the power converter 110. In some examples, the value representative of IL is a current signal directly indicating IL. In other examples, the value representative of IL is a voltage signal indicating a voltage corresponding and/or having a relationship (e.g., according to Ohm's law) to IL. The sense element is, for example, a sense resistor, a transistor, or any other component or combination of components capable of measuring and/or quantifying IL of the power converter 110 and providing the value representative of IL to the controller 105.

In at least one example, the predictive timer 120 is any circuitry suitable for independently determining TON and TOFF for the power converter 110, and a particular architecture or scope of the predictive timer 120 is not limited herein. In various examples, the predictive timer 120 receives Vin, Vout, at least one output of the loop controller 115, and an indication of whether the power converter 110 is operating in the buck region, boost region, or buck-boost region. The indication of whether the power converter 110 is operating in the buck region, boost region, or buck-boost region is received from, for example, a region detector (not shown) configured to determine the region of operation of the power converter 110 (e.g., such as according to Vin, Vout, and/or IL). In some examples, the region detector is included within the controller 105 while in other examples the region detector is implemented external to the controller 105 and the controller 105 is configured to couple to the region detector. In some examples (such as when the power converter is implemented only as a buck power converter or a boost power converter), the region detector may be omitted.

In at least one example, the loop controller 115 is coupled to the predictive timer 120 and the power converter 110 and is configured to receive Vref and Vout, for example, at least partially for use in controlling the predictive timer 120. In another example, the loop controller 115 further receives the value representative of IL from the sense element of the power converter 110 for use in controlling the predictive timer 120. Based on the received inputs (e.g., Vin, Vout, the value representative of IL, and/or Vref), the loop controller 115 controls the predictive timer 120 to provide signals to the gate driver 125 to control power transistors (not shown) of the power converter 110 to generate Vout. In one example, the predictive timer 120 controls the gate driver 125 according to a determined TON and/or TOFF for at least some power transistors of the power converter 110. For example, the predictive timer 120 determines TON and/or TOFF and provides control signals to the gate driver 125 indicating whether the gate driver 125 should control the power converter 110 to operate in TON or TOFF. For example, when the power converter 110 is controlled to operate in TON, an inductor of the power converter 110 charges. When the power converter 110 is controlled to operate in TOFF, an inductor of the power converter 110 discharges.

In various examples, the gate driver 125 controls the power converter 110, based on control signals received from the predictive timer 120, according to a peak current mode implementation of the power converter 110 (e.g., in which the power transistors of the power converter 110 are controlled based on IL of the power converter 110 rising to meet a threshold (e.g., such as based at least partially on Vref)).

In another example, the gate driver 125 controls the power converter 110, based on control signals received from the predictive timer 120, according to a valley mode implementation of the power converter 110 (e.g., in which the power transistors of the power converter 110 are controlled based on IL of the power converter 110 falling to meet a threshold (e.g., such as based at least partially on Vref)). For example, based on the calculated TON and/or TOFF, the predictive timer 120 controls the gate driver 125 to control TON of the power transistors in a peak current mode implementation of the power converter 110, or TOFF of the power transistors in a valley current mode implementation of the power converter 110, by providing at least one control signal to the gate driver 125. Additionally, while calculating TON and TOFF with respect to a peak current mode implementation of the power converter 110 and/or a valley current mode implementation of the power converter 110 are discussed herein, the present disclosure is not limited thereto. For example, the present disclosure is equally applicable to any system that utilizes TON and/or TOFF times for one or more transistors, whether related to controlling a power converter or unrelated to controlling a power converter.

In at least one example, the loop controller 115 integrates Vout (or a scaled version of Vout, such as scaled via a voltage divider) and Vref. In another example, the loop controller 115 compares Vout (or a scaled version of Vout, such as scaled via a voltage divider) to Vref. A result of the integration (or the comparison) is compared to the value representative of IL. A result of the comparison is, for example, used to at least partially control the predictive timer 120. In at least one example, the output of the comparison may be a logical high signal when the value representative of IL is less than the result of the integration (or the comparison) and the power converter 110 is implemented using the peak current mode implementation. When the value representative of IL is not less than the result of the integration (or the comparison) the output of the comparison may be a logical low signal. In another example, the output of the comparison may be a logical high signal when the value representative of IL is greater than the result of the integration (or the comparison) and the power converter 110 is implemented using the valley current mode implementation. When the value representative of IL is not greater than the result of the integration (or the comparison) the output of the comparison may be a logical low signal. In various examples, the loop controller 115 includes any suitable circuitry or components for at least partially controlling the predictive timer 120 to control the power converter 110 via the gate driver 125, as disclosed herein.

In at least one example, the loop controller 115 may comprise an integrator (not shown) and a comparator (not shown). In another example, the loop controller 115 may comprise the comparator (not shown) without also comprising an integrator. In another example, the loop controller 115 may further include, or be coupled to, a voltage divider (not shown) that may scale the value of Vout. In another example, the loop controller 115 may further include one or more supporting components (not shown) such as resistors, capacitors, diodes, and the like, a scope of which is not limited herein. In some examples, the loop controller 115 provides any number of control signals to the predictive timer 120 for controlling the gate driver 125.

In various examples, the gate driver 125 is any suitable driver, component, or combination of components for controlling the power converter 110 (e.g., by coupling to, and exerting control on, gate terminals of the power transistors of the power converter 110). In at least one example, the gate driver 125 includes at least one driver (not shown) configured to generate a high-current control gate drive signal based on a received input signal. For example, when the gate driver 125 receives a first input signal from the predictive timer 120, the gate driver 125 may control a first subset of power transistors of the power converter 110 to turn (or remain) on while controlling a remainder of the power transistors of the power converter 110 to remain (or turn) off. When the gate driver 125 receives a second input signal from the predictive timer 120, the gate driver 125 may control a second subset of the power transistors of the power converter 110 to turn (or remain) on and a remainder of the power transistors of the power converter 110 to remain (or turn) off.

Figure 2:
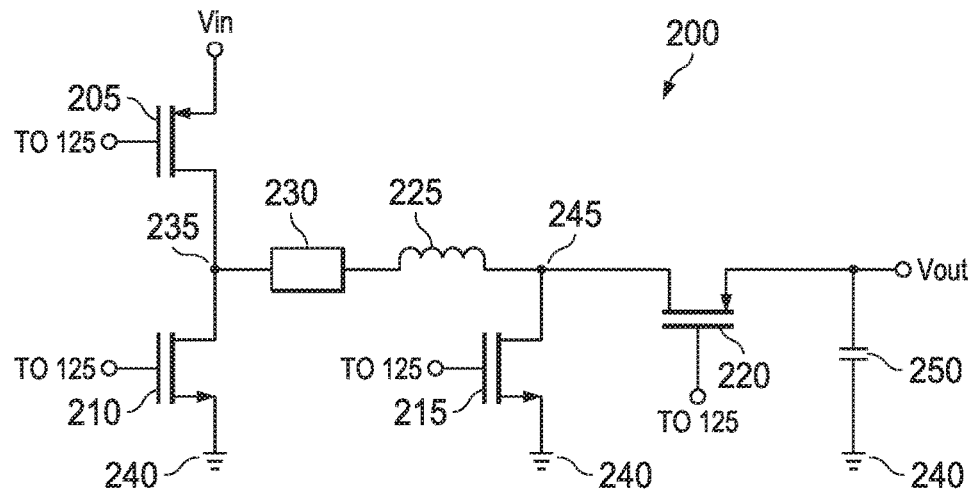
FIG. 2 is a schematic diagram of an illustrative buck-boost power converter.

Referring now to FIG. 2, a schematic diagram of an illustrative buck-boost power converter 200 is shown. In at least one example, the buck-boost power converter 200 is suitable for implementation as the power converter 110, under control of the controller 105, of the SMPS 100 of FIG. 1, discussed above. In one example, the buck-boost power converter 200 includes a plurality of MOSFETs 205, 210, 215, and 220, and at least one energy storage device (illustrated in this example as an inductor 225). In another example, the buck-boost power converter 200 further includes a second inductor (not shown) and/or a fly-capacitor (not shown). In one example, the MOSFETs 205 and 220 are implemented as p-type MOSFETs (PMOS) and the MOSFETs 210 and 215 are implemented as n-type MOSFETs (NMOS). In at least one example, the buck-boost power converter 200 further includes a sense element 230 suitable for sensing IL of the inductor 225. The sense element 230 is, for example, a MOSFET, a resistor, or any other suitable means of sensing, measuring, or detecting IL. In at least one example, the sense element 230 is implemented by one of the MOSFETs 205, 210, 215, or 220 such that the sense element 230 is not an independent, additional component of the buck-boost power converter 200. In another example, by omitting the MOSFETs 215 and 220 the buck-boost power converter 200 may be converted to a buck converter (not shown). In yet another example, by omitting the MOSFETS 205 and 210 the buck-boost power converter 200 may be converter to a boost converter (not shown).

In one example architecture, a source terminal of the MOSFET 205 is configured to receive Vin, a drain terminal of the MOSFET 205 is coupled to a node 235, and a gate terminal of the MOSFET 205 is coupled to a controller (e.g., such as the gate driver 125 of the controller 105 of the SMPS 100 of FIG. 1, discussed above). A drain terminal of the MOSFET 210 is coupled to the node 235, a source terminal of the MOSFET 210 is coupled to a ground node 240, and a gate terminal of the MOSFET 210 is coupled to the controller. A first terminal of the inductor 225 is coupled to the node 235 and a second terminal of the inductor 225 is coupled to a node 245. In at least one example, the sense element 230 is coupled in series between node 235 and the first terminal of the inductor 225. In another example, a drain terminal of the MOSFET 215 is coupled to the node 245, a source terminal of the MOSFET 215 is coupled to the ground node 240, and a gate terminal of the MOSFET 215 is coupled to the controller. A drain terminal of the MOSFET 220 is coupled to the ground node 240, a source terminal of the MOSFET 220 provides Vout from the buck-boost power converter 200 (e.g., such that the source terminal of the MOSFET 220 is configured to couple to a load (not shown), and a gate terminal of the MOSFET 220 is coupled to the controller. In at least one example, the inductor 225 is implemented as an external component such that the buck-boost power converter 200 does not include the inductor 225 but is configured to couple to the inductor 225 between the node 235 and the node 245. In at least one example, the buck-boost power converter 200 is configured to couple to a capacitor 250 (e.g., such as a filtering capacitor) between the source terminal of the MOSFET 220 and the ground node 240.

In one example, the MOSFETs 205, 210, 215, and/or 220 are controlled to turn on (e.g., conduct current between their respective drain terminals and source terminals) and/or turn off (e.g., cease conducting current between their respective drain terminals and source terminals) based on a signal received at their respective gate terminals. For example, based on a signal (e.g., a control signal) received from the controller, one or more of the MOSFETs 205, 210, 215, and/or 220 are controlled to turn on or turn off. The MOSFETs 205, 210, 215, and/or 220 may turn on (or off) based on a value, or relationship between values, present at one or more of the respective gate terminals and/or source terminals of the MOSFETs 205, 210, 215, and/or 220.

As further illustrated in FIG. 2, in at least one example the buck-boost power converter 200 is configured to operate in multiple operations modes. During a first operation mode (e.g., TON), MOSFETs 205 and 215 are controlled by the controller to be turned on while MOSFETs 210 and 220 are controlled by the controller to be turned off. During the first operation mode, a path from Vin to ground is formed through the MOSFET 205, inductor 225, and MOSFET 215, thereby enabling the inductor 225 to charge from Vin. During a second operation mode (e.g., TOFF), MOSFETs 205 and 215 are controlled by the controller to be turned off while the MOSFETs 210 and 220 are controlled by the controller to be turned on. During the second operation mode, a path from the ground node 240 to a node (e.g., the source terminal of the MOSFET 220) of the buck-boost power converter 200 to which a load may couple to receive Vout is formed through the MOSFET 210, inductor 225, and MOSFET 220, thereby enabling the inductor 225 to discharge to provide Vout. In at least some examples that include a third operation mode (e.g., a common (COM) operation mode), during the third operation mode MOSFETs 205 and 220 are controlled by the controller to be turned on and the MOSFETs 210 and 215 are controlled by the controller to be turned off. During the third operation mode, Vin and Vout have approximately the same value such that a voltage difference across the inductor 225 is minimal. When the voltage difference across the inductor 225 is minimal, in at least one example the inductor 225 may function approximately as a short between Vin and Vout with minimal effects on the value of Vout.

Figure 3:
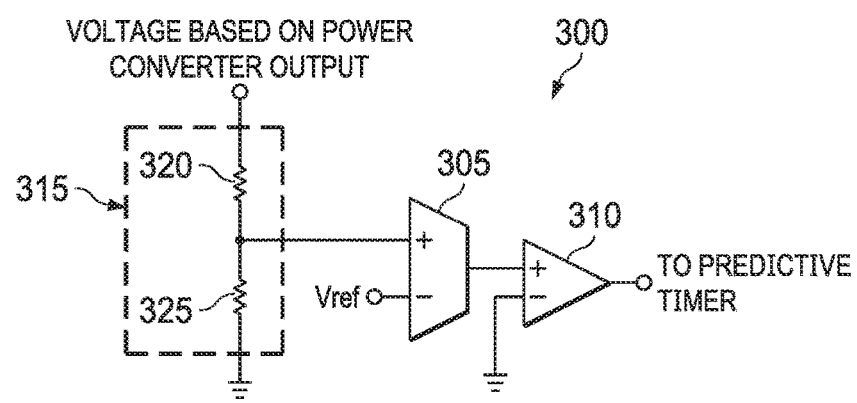
FIG. 3 is a block diagram of an illustrative loop controller.

Referring now to FIG. 3, a block diagram of an illustrative loop controller 300 is shown. In at least one example, the loop controller 300 is suitable for implementation in a SMPS such as implementation as the loop controller 115 of the SMPS 100 of FIG. 1, discussed above. In at least one example, the loop controller 300 includes an integrator 305 and a comparator 310. In some examples, the loop controller 300 further includes, or is configured to couple to, a voltage divider 315 comprising a resistor 320 and a resistor 325 coupled, or configured to couple, in series between the output of the power converter and a ground potential. In at least some examples, the loop controller 300 further includes, or is configured to couple to, one or more additional components (not shown) such as resistors, capacitors, diodes (e.g., to limit a positive and/or negative voltage at a node in the loop controller 300), etc.

In one example architecture, a first input of the integrator 305 is configured to receive a feedback signal at least partially based on a value present at an output of a power converter controlled at least partially according to the loop controller 300. For example, the first input of the integrator 305 may be coupled to, or configured to couple to, the output of the power converter. Alternatively, the first input of the integrator 305 may be coupled to, or configured to couple to, an intermediary component such as the voltage divider 315 to receive a feedback signal based at least partially on the value present at the output of the power converter. A second input of the integrator 305 is configured to receive a reference value. The reference value, in some examples, is representative and/or indicative of a desired output voltage and/or current of the power converter controlled at least partially according to the loop controller 300. For example, the reference value may be substantially equal to the desired output voltage and/or current or may be substantially equal to a scaled representation of the desired output voltage and/or current. When the reference value is substantially equal to a scaled representation of the desired output voltage and/or current, a scaling factor of the reference value may be approximately equal to a ratio of the resistor 320 to the resistor 325. In at least one example, the reference value is received from a component (not shown) internal to the loop controller 300 and/or the SMPS. The component may be, for example, an internal band-gap reference suitable for providing the reference value. In another example, the reference value is received from a component outside of the loop controller 300 and/or the SMPS and to which the integrator 305 is configured to couple either directly or indirectly. The component outside of the loop controller 300 and/or the SMPS is, for example, a voltage regulator, micro-controller, a processor, and/or any other device suitable for providing the reference value to the loop controller 300.

In at least one example, an output of the integrator 305 is coupled to a first input of the comparator 310 and a second input of the comparator 310 is coupled to, or configured to couple to, a sense element of the power converter controlled at least partially according to the loop controller 300. In some examples, a value present at, measured by, or otherwise provided to the comparator 310 by coupling to the sense element indicates an amount of current flowing through the power converter (e.g., such as through an inductor of the power converter when the power converter is a buck-boost power converter). In at least one example, when the value received at the first input of the comparator 310 exceeds the input received at the second input of the comparator 310, a value present at the output of the comparator 310 has a logical high value. In at least some examples, the value present at the output of the comparator 310 is at least partially used for controlling operation of the power converter (e.g., such as controlling a predictive timer to control a gate driver to drive or control gate terminals of power transistors of the power converter as described above with respect to FIGS. 1 and 2).

Figure 4:
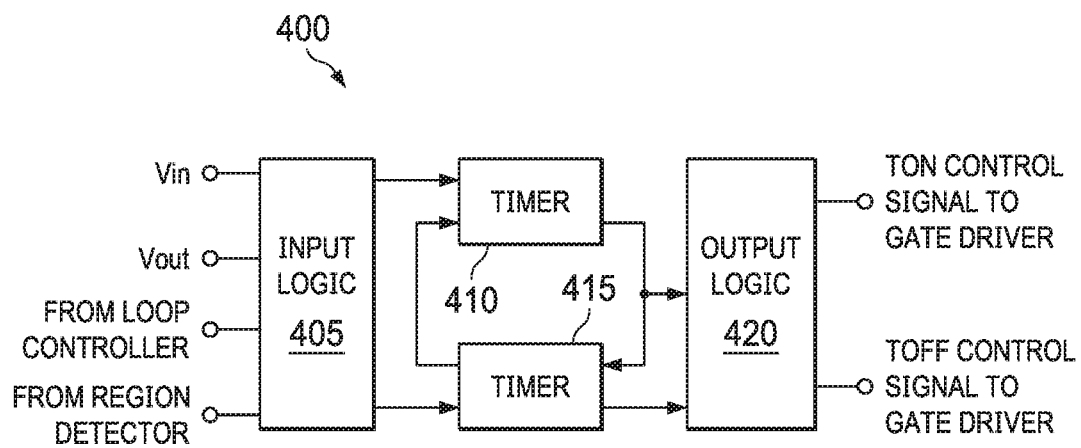
FIG. 4 is a block diagram of an illustrative predictive timer.

Referring now to FIG. 4, a block diagram of an illustrative predictive timer 400 is shown. In at least one example, the predictive timer 400 is suitable for implementation in a SMPS such as implementation as the predictive timer 120 of the SMPS 100 of FIG. 1, discussed above. In at least one example, the predictive timer 400 includes input logic 405, a first timer 410 (e.g., a calculated timer), a second timer 415 (e.g., a follow timer), and output logic 420. In some examples, the first timer 410 and the second timer 415 are each respectively coupled to outputs of the input logic 405, the output logic 420 is coupled to respective outputs of the first timer 410 and the second timer 415, the second timer 415 is coupled to the output of the first timer 410, and the first timer 410 is coupled to the output of the second timer 415.

In various examples, the input logic 405 is any suitable logical structure suitable for receiving a plurality of inputs and providing an output signal for controlling the first timer 410 and/or the second timer 415, wherein the output signal is determined according to values of at least some of the plurality of inputs, a scope of which is not limited herein. For example, the input logic 405 may be any one or more of digital logic structures (e.g., one or more combinations of digital logic gates configured to provide an output according to values of at least some of the plurality of inputs), analog circuits or components operable as logical structures, analog circuits such as a multiplexer, digital and/or analog circuits configured to receive multiple signals and select at least one of the multiple signals for output, a field-programmable gate array (FPGA), a state machine, or any other circuits, components, or devices capable of performing logical operations, a scope of which is not limited herein.

In at least one example, the first timer 410 includes any suitable circuits, components, or devices capable of operation as a timer, a scope of which is not limited herein. It at least one example, the second timer 415 includes substantially identical hardware to the first timer 410.

In various examples, the output logic 420 is any suitable logical structure suitable for receiving inputs from the first timer 410 and the second timer 415 and providing an output signal for controlling a gate driver to control TON and TOFF times of a power converter according to values of at least some of the inputs, a scope of which is not limited herein. For example, the output logic 420 may be any one or more of digital logic structures (e.g., one or more combinations of digital logic gates configured to provide an output according to values of at least some of the plurality of inputs), analog circuits or components operable as logical structures, a field-programmable gate array (FPGA), a state machine, or any other circuits, components, or devices capable of performing logical operations, a scope of which is not limited herein.

In at least one example of operation, the input logic 405 is configured to receive a plurality of input signals and generate one or more output signals. The input signals include, for example, any combination of Vin, Vout, an output of a loop controller (e.g., the output of the loop controller 300 of FIG. 3) configured to at least partially control a power converter, and/or one or more signals indicating a region of operation of the power converter under control of the predictive timer 400. The output signals include, for example, start signals and/or speed control signals for controlling each of the first timer 410 and the second timer 415. For example, based on one or more of the input signals, the input logic 405 generates signals that begin timers of the first timer 410 and/or the second timer 415 (e.g., by toggling switches of the first timer 410 and/or the second timer 415). In another example, the input logic 405 generates a signal that begins counting of the first timer 410 and the second timer 415 begins counting based on an output of the first timer 410. In another example, based on one or more of the input signals, the input logic 405 generates signals that control a speed of the first timer and/or the second timer 415. For example, by varying a value (voltage value or current value) of a speed control signal, the input logic 405 controls a speed of operation of the first timer 410 and/or the second timer 415.

In at least one example, the first timer 410 determines a calculated time at least partially according to a ratio of Vout to Vin. The calculated time is, for example, TON during a buck region of operation and/or TOFF during a boost region of operation. In at least one example, the second timer 415 determines a follow time at least partially according to a switching period of the power converter. The follow time is, for example, TOFF during a buck region of operation and/or TON during a boost region of operation.

In at least one example, the output logic 420 receives outputs of the first timer 410 and the second timer 415 and, based at least partially on the outputs of the first timer 410 and the second timer 415, generates and outputs at least one control signal. For example, based at least partially on the outputs of the first timer 410 and the second timer 415, the output logic 420 generates (e.g., by calculating or otherwise determining) and outputs a TON control signal and a TOFF control signal. The TON control signal, for example, instructs a component (such as a gate driver) coupled to the output logic 420 to control a coupled power converter to operate in a TON mode. The TOFF control signal, for example, instructs a component (such as a gate driver) coupled to the output logic 420 to control a coupled power converter to operate in a TOFF mode. In some examples, the output logic 420 includes one to more storage devices (not shown) such as flip-flops, latches, or other components, devices, or structures suitable for storing data. In at least one example, the output logic 420 stores an output of the first timer 410 and/or the second timer 415. In some examples, the output logic 420 provides the stored values to the input logic 405, the first timer 410, and/or the second timer 415 for use in further processing and/or logical determinations. In other examples, the input logic 405 includes the storage devices (not shown) configured to store an output of the first timer 410 and/or the second timer 415 and provide the stored values to the output logic 420, the first timer 410, and/or the second timer 415 for use in further processing and/or logical determinations.

Figure 5:
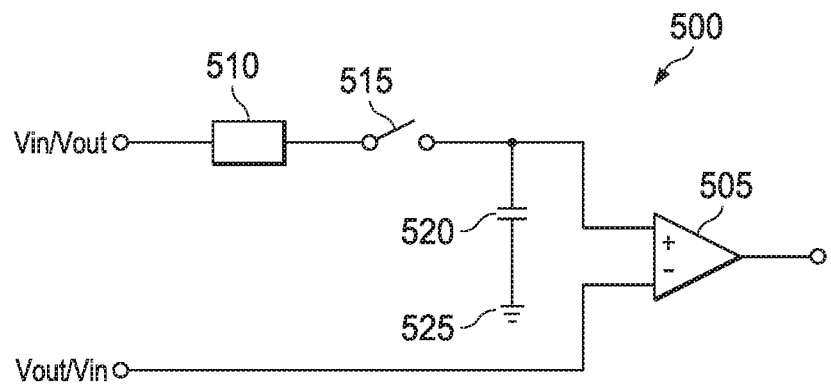
FIG. 5 is a block diagram of an illustrative timer.

Referring now to FIG. 5, a block diagram of an illustrative timer 500 is shown. In at least one example, the timer 500 is suitable for implementation in a predictive timer such as implementation as the calculated timer 410 and/or the follow timer 415 of the predictive timer 400 of FIG. 4, discussed above. In at least one example, the timer 500 includes a comparator 505, resistor 510, a switch 515, and a capacitor 520.

In one example, a first terminal of the resistor 510 is a first input of the timer 500, a second terminal of the resistor 510 is coupled to a first input of the comparator 505 via the switch 515, and the capacitor 520 is coupled between the first input of the comparator 505 and a ground node 525. A second input of the comparator 505 is a second input of the timer 500. In some examples, the resistor 510 is a controllable resistor (e.g., a potentiometer) having a third input of the timer 500. In some examples, the switch is implemented as a solid-state switch (e.g., a MOSFET or BJT transistor) or a mechanical switch (e.g., a relay) having a fourth input of the timer 500. The resistor 510 and the capacitor 520, in at least some examples, form a resistor-capacitor (RC) timer. In other examples, the resistor 510 and the capacitor 520 are omitted and any other suitable form of timer is implemented at the first input of the comparator 505. For example, the resistor 510 may be replaced by a controllable current source (not shown) to, along with the capacitor 520, implement the timer 500. Additionally, while illustrated and described herein as a resistor, the resistor 510 may instead be implemented as any suitable component, device, circuit, or combination thereof that functions as a resistive element and has a controllable and/or determinable value of resistance. Although not shown, in some examples the timer 500 further includes a second switch coupled between the first input of the comparator 505 and the ground node 525. The second switch is, in at least one example, a reset switch that, when closed, may discharge energy stored on the capacitor 520 and/or prevent the capacitor 520 from charging.

In one example of operation (e.g., during operation in a buck region), the timer 500 receives Vin at the first input of the timer 500 and receives Vout at the second input of the timer 500. In another example of operation (e.g., during operation in a boost region), the timer 500 receives Vin at the second input of the timer 500 and receives Vout at the first input of the timer 500. In at least some examples, at least one of Vin and/or Vout is scaled prior to receipt by the timer 500. In one example (such as when the timer 500 is implemented as the first timer 410 for a power converter in the buck region), the timer 500 outputs a logical high signal at a time determined according to the following equation 1:

$$t_{trip} = \left(\frac{Vout}{Vin}\right) * b * R * C, \quad (1)$$

where b is a scaling factor of Vout that is less than or equal to about one, R is a value of the resistance of resistor 510, and C is a value of the capacitance of capacitor 520. In at least some examples, by modifying R and/or modifying C a speed of operation of the timer 500 is altered. In another example, by inverting Vout and Vin in equation 1, equation 1 becomes representative of an output of the first timer 410 for a power converter in the boost region. For an example of the timer 500 implemented as the second timer 415 for the power converter in the boost region or in the buck region, the timer 500 outputs a logical high signal at a time determined according to the following equation 2:

$$t_{trip} = a * R * C, \quad (2)$$

where R*C is representative of the switching period of the power converter and is a constant less than or equal to about one. For example, when the timer 500 is implemented as the second timer 415, the timer 500 receives a*Vref at the second input of the timer 500 and receives Vref at the first input of the timer 500.

Figure 6:
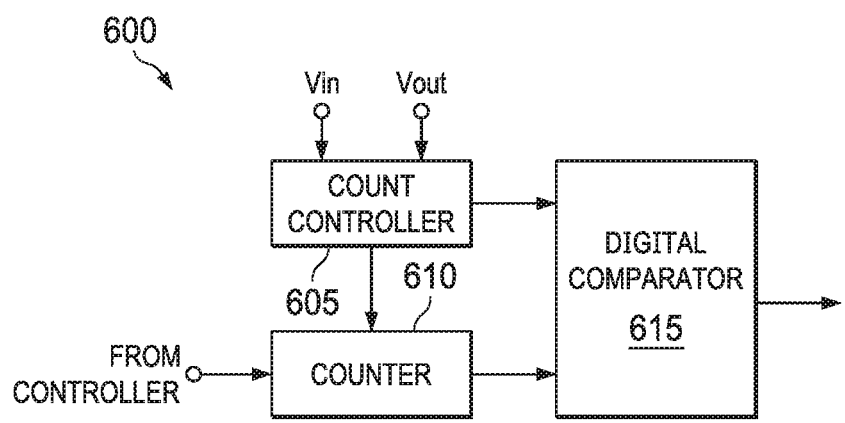
FIG. 6 is a block diagram of another illustrative timer.

Referring now to FIG. 6, a block diagram of another illustrative timer 600 is shown. In at least one example, the timer 600 is suitable for implementation in a predictive timer such as implementation as the calculated timer 410 and/or the follow timer 415 of the predictive timer 400 of FIG. 4, discussed above. In at least one example, the timer 500 includes a count controller 605, a counter 610, and a digital comparator 615.

In one example, the count controller 605 is configured to receive Vin and Vout and includes a first output coupled to the counter 610 and a second output coupled to the digital comparator 615. The counter 610 is configured to couple to a controller (not shown) such as the input logic 405 of FIG. 4 and receive a control signal (e.g., start, stop, pause, reset, etc.) from the controller at a first input and is coupled at a second input to the count controller 605 and at an output to a second input of the digital comparator 615. The digital comparator 615 is coupled at a first input to the second output of the count controller 605 and at a second input to the counter 610 and is configured to provide a logic level signal at an output of the digital comparator 615.

In at least one example of operation, the count controller 605 receives Vin and Vout and, based on Vin and Vout, generates a speed control signal for at least partially controlling the counter 610. The count controller 605 further generates a reference count based at least partially on Vin and Vout and provides the reference count to the digital comparator 615. The counter 610 receives the speed control signal from the count controller 605 and receives the control signal and, based on the control signal and the speed control signal, starts, pauses, or resets counting at a speed indicated by the speed control signal and provides a value representative of a current state of the counting to the digital comparator 615. The digital comparator 615 compares the reference count received from the count controller 605 and the value representative of the current state of the counting received from the counter 610 and, based on the comparison, generates and outputs a value indicating whether a first of the inputs received by the digital comparator 615 is less than, equal to, or greater than a second of the inputs received by the digital comparator 615.

Each of the count controller 605, counter 610, and/or digital comparator 615 are, in some examples, implemented as digital circuits. The digital circuits may include any combination of digital logic structures (e.g., digital logic gates, a FPGA, etc.) suitable for performing the operations discussed above. In addition, in some examples at least one count controller 605, the counter 610, and/or the digital comparator 615 may further include at least one analog circuit or structure.

While one example of an analog implementation of a timer has been described above with respect to FIG. 5 and one example of a digital implementation of a timer has been described with respect to FIG. 6, such examples are not so limiting. Instead, the present disclosure encompasses circuits having variations in architecture, layout, structure, composition, and/or any other characteristic that, although including fewer, more, different, and/or rearranged components than the examples included herein, provides substantially the same functionality and/or operates according to a control scheme substantially similar to that described herein.

Figure 7:
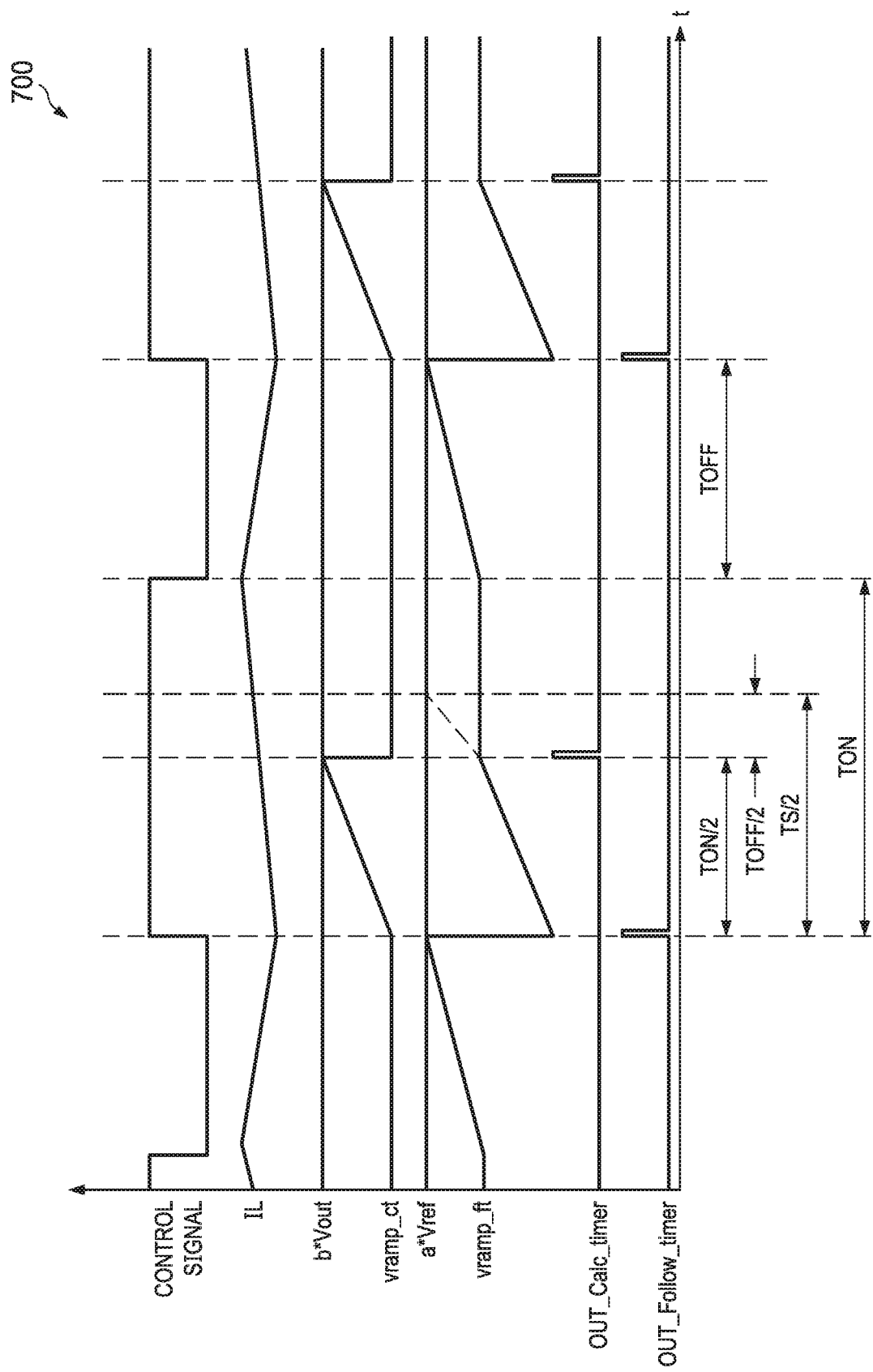
FIG. 7 is an illustrative timing diagram for estimating an off-time (TOFF) of a power converter in a buck region.

Referring now to FIG. 7, an illustrative timing diagram 700 for estimating TOFF in a power converter in a buck region is shown. In at least one example, by replacing each instance of TON with TOFF and replacing each instance of Vout with Vin in diagram 700, the diagram 700 illustrates predicting TON in a power converter in a boost region. The diagram 700, in some examples, is illustrative of operation of the predictive timer 400 of FIG. 4 and is discussed herein with reference to components of the predictive timer 400. As shown in FIG. 7, the horizontal access of the waveforms is measured in time (t), vramp_ct is the voltage present at a timing node of the timer 410, and vramp_ft is a voltage present at a timing node of the timer 415. At the rising edge of a received Control Signal, the input logic 405 controls the first timer 410 and the second timer 415 to begin counting in parallel. While illustrated in FIG. 7 as operating at 2× speed (e.g., such that the calculated timer trips at TON/2), in various embodiments the predictive timer may operate at any suitable speed.

The first timer 410 calculates TON in one-half of the timer period of TON by virtue of timer 500 operating at 2× speed as discussed above such that the first timer 410 outputs an OUT_Calc_timer signal at time TON/2. As discussed above, the second timer 415 has a fixed tripping time of one-half of Ts of the power converter under control of the predictive timer 400 such that at time TON/2, a remaining charging time until tripping of the second timer 415 is TOFF/2. The predictive timer 400 pauses the second timer 415 at time TON/2, in some examples, based on an output of the first timer 410. In some examples, the second timer 415 is paused by opening a switch of the second timer 415 such that a capacitor of the second timer 415 stops charging until the switch is closed. The switch is controlled, for example, by at least one of the input logic 405 or the first timer 410.

The second timer 415 is maintained in the paused (e.g., on hold) state until a falling edge of TON at which TOFF begins. When TOFF begins, the second timer resumes, for example, by the predictive timer 400 closing the switch of the second timer 415 such that the capacitor of the second switch 415 resumes charging. When the second timer 415 resumes counting, the input logic 405 controls the second timer 415 to operate at 1× speed, as discussed above. When the second timer 415 trips (e.g., at the end of the TOFF time predicted by the predictive timer 400), the second timer 415 outputs an OUT_Follow_timer signal. The predictive timer 400 starts the first timer 410, in some examples, based on an output of the second timer 415. In some examples, the first timer 410 is started by closing a switch of the first timer 410 such that a capacitor of the first timer 410 begins charging until the switch is opened. The switch is controlled, for example, by at least one of the input logic 405 or the second timer 415. In at least some examples, the output logic 420 generates TON and TOFF control signals for controlling a gate driver based at least partially on OUT_Calc_timer and OUT_Follow_timer (e.g., such that TON begins when approximately when the second timer 415 outputs OUT_Follow_timer).

Figure 8:
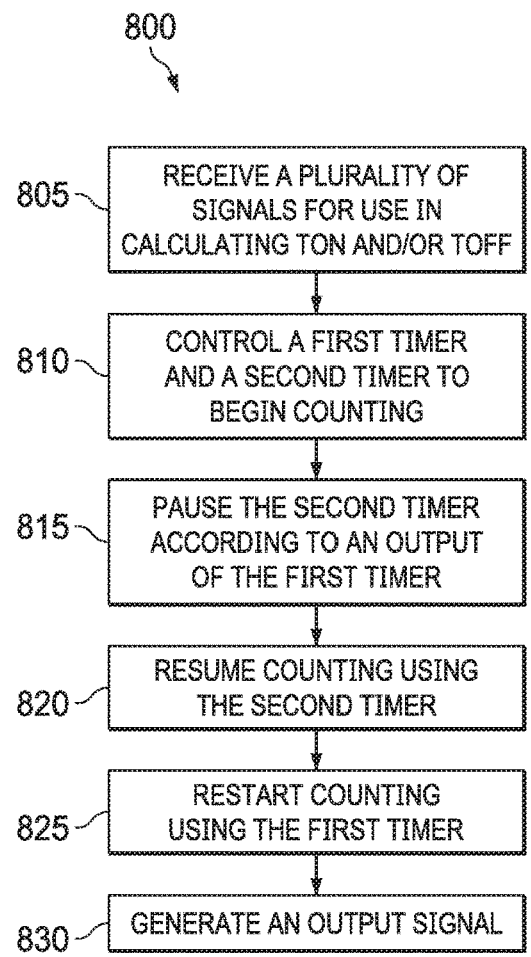
FIG. 8 is a flowchart of an illustrative method for predicting time in a power converter.

Referring now to FIG. 8, a flowchart of an illustrative method 800 for predicting time in a power converter is shown. The method 800 is implemented, for example, by a predictive timer, such as the predictive timer 400 of FIG. 4, to calculate TON and TOFF for controlling a power converter. At operation 805, the predictive timer receives a plurality of signals for use in calculating TON and/or TOFF. The signals include, for example, any combination of Vin, Vout, an output of a loop controller (e.g., the output of the loop controller 300 of FIG. 3) configured to at least partially control a power converter, and/or one or more signals indicating a region of operation of the power converter under control of the predictive timer.

At operation 810, the predictive timer controls a first timer and a second timer to begin counting. The predictive timer controls the first timer and the second timer to begin counting by, for example, transmitting signals to close switches of the first timer and the second timer to create a conductive path through the first timer and the second timer, respectively. The predictive timer controls the first timer and the second timer to begin counting, for example, at an edge transition of a control signal for controlling at least some power transistors of the power converter. In some examples, the predictive timer further controls the first timer and the second timer by controlling a value of resistance in at least one of the first timer and/or the second timer to control a speed of operation of the first timer and/or the second timer, respectively.

At operation 815, the predictive timer pauses the second timer according to an output of the first timer. In one example, the first timer controls the second timer to pause counting at an expiration of the first timer. The first timer controls the second timer to pause counting by, for example, outputting a signal configured to cause the switch of the second timer closed at operation 810 to be opened. The first timer outputs the signal, in some examples, when the first timer, based on a first of Vin or Vout, exceeds a reference voltage, based on a second of Vin or Vout. Pausing the second timer at the expiration of the first timer, in at least some examples, establishes a remaining period of time of the second timer as a calculated (e.g., predicted) TOFF for the power converter. For example, when the first timer and the second timer are controlled at operation 810 to count at greater than 1× speed until expiration of the first timer and pausing of the second timer at operation 815, a period of time remaining before expiration of the second timer when the second timer resumes counting at 1× speed defines the calculated TOFF of the power converter and thereby facilitates prediction and control of TOFF for a power converter.

At operation 820, the predictive timer controls the second timer to resume counting. The predictive timer controls the second timer to resume counting, for example, by outputting a signal configured to cause the switch of the second timer opened at operation 815 to be closed. The predictive timer controls the second timer to resume counting, for example, at another edge transition of the control signal for controlling at least some power transistors of the power converter. The predictive timer provides the signal to the switch of the second timer, for example, at a falling edge of TON in a buck converter (or a falling edge of TOFF in a boost converter).

At operation 825, the predictive timer controls the first timer and the second timer to restart counting. In one example, the second timer controls the first timer to restart counting. The second timer controls the first timer to restart counting by, for example, outputting a signal configured to cause the switch of the first timer to be closed. The second timer controls the first timer to restart counting, for example, upon expiration of the second timer and at another edge transition of the control signal for controlling at least some power transistors of the power converter. The second timer outputs the signal, in some examples, when the second timer, based on a first of Vin or Vout and paused at operation 815, exceeds a reference voltage, based on a second of Vin or Vout. In another example, the predictive timer controls both the first timer and the second timer to restart counting after the second timer outputs the signal.

At operation 830 the predictive timer generates at least one output signal. The output signal is generated, at least partially based on the output signal of the first timer and/or the output signal of the second timer. The output signal is, for example, a TON control signal and/or a TOFF control signal. The TON control signal and/or the TOFF control signal, in some examples, is provided to a gate driver for controlling.

While the operations of the method 800 have been discussed and labeled with numerical reference, the method 800 may include additional operations that are not recited herein, any one or more of the operations recited herein may include one or more sub-operations, any one or more of the operations recited herein may be omitted, and/or any one or more of the operations recited herein may be performed in an order other than that presented herein (e.g., in a reverse order, substantially simultaneously, overlapping, etc.), all of which is intended to fall within the scope of the present disclosure.

Figure 9:
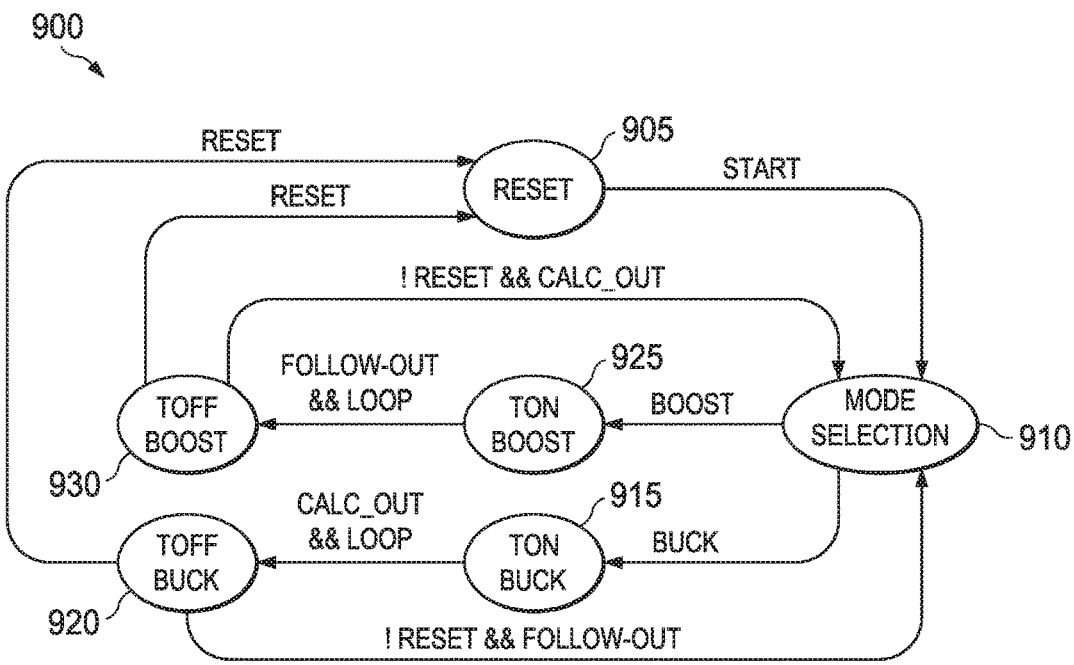
FIG. 9 is an illustrative state diagram.

Referring now to FIG. 9, an illustrative state diagram 900 is shown. In at least one example, the state diagram 900 corresponds to operations of the predictive timer 400 of FIG. 4, discussed above. For example, the state diagram 900 corresponds to execution of the method 800 of FIG. 8, discussed above, by the predictive timer 400.

In at least one example, the predictive timer 400 begins operations at state 905. State 905 is a reset state in which the predictive timer resets prior to transition to state 910. At state 910, the predictive timer 400 selects a mode of operation for controlling a power converter under control of a power converter controller including the predictive timer 400. The mode of operation for controlling the power converter, in at least one example, is determined according to one or more signals received by the predictive timer 400 from a region detector that determines a mode of operation in which the power converter is currently operating. When the one or more signals received by the predictive timer 400 from the region detector indicate that the power converter is operating in a buck region, the predictive timer 400 controls the power converter according to buck operation to turn on (e.g., operate in TON phase) and transitions to state 915. In at least one example, the transition to state 915 is further determined based on an input signal (loop) received by the predictive timer 400 from a loop controller. The input, for example, indicates that a value of a signal representative of an output of the power converter exceeds (either in a positive direction or a negative direction) a value of a reference signal. The predictive timer 400 controls the power converter, in one example, by providing one or more control signals to a gate driver for controlling one or more gate terminals of power transistors of the power converter. The predictive timer 400 further controls the first timer 410 and the second timer 415 to begin counting.

At state 915, the predictive timer 400 maintains the power converter in the TON phase. During the TON phase, the first timer 410 and the second timer 415 of the predictive timer 400 are controlled to continue counting until the first timer 410 expires. When the first timer 410 expires, the first timer 410 outputs a signal (calc_out) configured to cause the second timer 415 to pause counting. In at least one example, the signal output by the first timer 410 is stored (e.g., latched via a digital flip-flop) for subsequent use by the predictive timer 400. The predictive timer 400 remains at state 910 until both a value of the input received by the predictive timer 400 from the loop controller and a value of a signal based on an output of the first timer 410 are logical high values. When both the value of the input received by the predictive timer 400 from the loop controller and the value of the signal based on the output of the first timer 410 are logical high values (e.g., as determined by performing a logical AND operation), the predictive timer 400 transitions to state 920. The signal based on the output of the first timer 410, in one example, is the output of the first timer 410. In another example, the signal based on the output of the first timer 410 is the stored signal output by the first timer 410.

At state 920, the predictive timer 400 controls the power converter to turn off (e.g., operate in a TOFF phase) by providing one or more control signals to the gate driver for controlling one or more gate terminals of power transistors of the power converter. When the predictive timer 400 controls the power converter to turn off, the predictive timer 400 further controls the second timer 415 to resume counting. The predictive timer 400 remains at state 920 until the value of an output signal (follow out) of the second timer 415 is a logical high value. When the output of the second timer 415 is a logical high value, and the predictive timer 400 has not received or generated a logical high reset signal, the predictive timer 400 transitions back to state 910. When the predictive timer 400 generates or receives a reset signal, the predictive timer 400 transitions from state 920 to state 905.

Returning now to state 910, when the one or more signals received by the predictive timer 400 from the region detector indicate that the power converter is operating in a boost region, the predictive timer 400 controls the power converter according to boost operation to turn on (e.g., operate in TON phase) and transitions to state 925. The predictive timer 400 further controls the first timer 410 and the second timer 415 to begin counting.

At state 925, the predictive timer 400 maintains the power converter in the TON phase. During the TON phase, the second timer 415 of the predictive timer 400 is controlled to continue counting (e.g., resume counting after previously receiving a signal causing the second timer 415 to pause counting) until the second timer 415 expires. In at least one example, a signal output by the second timer 415 upon expiration of the second timer 415 is stored (e.g., latched via a digital flip-flop) for subsequent use by the predictive timer 400. The predictive timer 400 remains at state 920 until both a value of the input received by the predictive timer 400 from the loop controller and a value of the signal output by the second timer 415 are logical high values. When both the value of the input received by the predictive timer 400 from the loop controller and the value of the signal output by the second timer 415 are logical high values (e.g., as determined by performing a logical AND operation), the predictive timer 400 transitions to state 930.

At state 930, the predictive timer 400 controls the power converter to turn off (e.g., operate in a TOFF phase) by providing one or more control signals to the gate driver for controlling one or more gate terminals of power transistors of the power converter. When the predictive timer 400 controls the power converter to turn off, the predictive timer 400 further controls the first timer 410 and the second timer 415 to reset and begin counting. The predictive timer 400 remains at state 925 until a value of an output of the first timer 415 is a logical high value. When the value of the output of the first timer 410 is a logical high value, the predictive timer 400 transitions to state 920. When the first timer 410 expires, the first timer 410 outputs a signal (calc_out) configured to cause the second timer 415 to pause counting. When the output of the first timer 410 is a logical high value, and the predictive timer 400 has not received or generated a logical high reset signal, the predictive timer 400 transitions back to state 910. When the predictive timer 400 generates or receives a reset signal, the predictive timer 400 transitions from state 930 to state 905.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device, element or component couples to a second device, element or component, that connection may be through a direct connection or through an indirect connection via other devices, elements or components and connections. Similarly, a device that is coupled between a first component or location and a second component or location may be through a direct connection or through an indirect connection via other devices and connections. Components such as resistors, capacitors, and/or inductors illustrated and/or described herein as a single component may instead be implemented as a combination of elements with like functionality coupled in any series or parallel manner, at least some of which may be individually controllable such as via switches. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A switched mode power supply (SMPS), comprising:
a power converter having an output; and
a controller, that includes:
   a loop controller having an input coupled to the output of the power converter, and having an output that is a control signal responsive to an electrical characteristic of the power converter;
   a predictive timer having an input coupled to the output of the loop controller and adapted to independently determine an on-time (TON) and an off-time (TOFF) for at least some power transistors of the power converter; and
   a gate driver having an input coupled to the output of the predictive timer and having an output coupled to the power converter and adapted to control the power converter responsive to the determined TON and the determined TOFF; and
   wherein the predictive timer is configured to:
      start a first timer and a second timer at a first edge transition of a control signal provided by the gate driver to control some power transistors of the power converter; pause the second timer at an expiration of the first timer; resume the second timer at a second edge transition of the control signal provided by the gate driver to control some power transistors of the power converter; and initiate a third edge transition of the control signal provided by the gate driver at an expiration of the second timer.

2. The SMPS of claim 1, wherein the predictive timer includes:
an input circuit coupled to the loop controller and the power converter and having a first start signal output and a second start signal output;
the first timer having a first input coupled to the first start signal output of the input circuit;
the second timer having:
   a first input coupled to the second start signal output of the input circuit;
   a second input corresponding to a pause input coupled to an output of the first timer; and
   an output coupled to a second input of the first timer, wherein the second input of the first timer corresponds to a restart input; and
   an output circuit coupled to the output of the first timer, the output of the second timer, and the gate driver.

3. The SMPS of claim 1, wherein the predictive timer is configured to independently determine the TON and the TOFF according to the first timer and the second timer implemented in the predictive timer.

4. The SMPS of claim 1, wherein the predictive timer comprises the first timer that includes: a first element having a first terminal coupled to a first voltage source; a capacitor coupled between a first node and a ground node; a switch coupled between a second terminal of the first element and the first node; and a comparator coupled at a first input to the first node and at a second input to a second voltage source.

5. The SMPS of claim 4, wherein the first element is a resistive element.

6. The SMPS of claim 4, wherein the first element is a current source.

7. The SMPS of claim 1, wherein a load is coupled to the output of the power converter.

8. A method, comprising:
receiving signals for use in calculating an on-time (TON) and an off-time (TOFF);
controlling a first timer and a second timer to begin counting at an edge transition of a control signal for controlling some power transistors of a power converter;
controlling the second timer to pause counting at an expiration of the first timer;
controlling the second timer to resume counting at another edge transition of the control signal for controlling some power transistors of the power converter;
controlling the first timer to resume counting at an expiration of the second timer; and
generating an output signal based on an output of the first timer and the second timer.

9. The method of claim 8, wherein controlling the second timer to pause includes opening a switch of the second timer.

10. The method of claim 8, wherein the first timer and the second timer are controlled to operate at a first speed before pausing the second timer, and wherein the second timer is controlled to operate at a second speed after resuming the second timer.

11. The method of claim 8, wherein the expiration of the second timer causes another edge transition of the control signal for controlling some power transistors of the power converter.

12. The method of claim 8, wherein generating the output signal includes generating at least one of a TON control signal or a TOFF control signal in response to the output of the first timer and the second timer.

13. A controller, comprising:
a loop controller having an input configured to be coupled to an output of a power converter, the loop controller having an output that is a control signal responsive to the output of the power converter;
a predictive timer having an input coupled to the output of the loop controller and adapted to independently determine an on-time (TON) and an off-time (TOFF) for at least some power transistors by:
   starting a first timer and a second timer at a first edge transition of a control signal provided by a gate driver to control some power transistors of the power converter;
   pausing the second timer at an expiration of the first timer;
   resuming the second timer at a second edge transition of the control signal; and
   initiating a third edge transition of the control signal at an expiration of the second timer; and
the gate driver having an input coupled to the output of the predictive timer.

14. The controller of claim 13, wherein the predictive timer includes:
an input circuit coupled to the output of the loop controller and having a first start signal output and a second start signal output;

the first timer having a first input coupled to the first start signal output of the input circuit;
the second timer having:
- a first input coupled to the second start signal output of the input circuit;
- a second input corresponding to a pause input coupled to an output of the first timer; and
- an output coupled to a second input of the first timer, wherein the second input of the first timer corresponds to a restart input; and an output circuit coupled to the output of the first timer, the output of the second timer, and the gate driver.

15. The controller of claim 13, wherein the predictive timer is configured to independently determine the TON and the TOFF according to the first timer and the second timer.

* * * * *